(12) United States Patent
Reichel

(10) Patent No.: US 6,597,228 B1
(45) Date of Patent: Jul. 22, 2003

(54) DIODE-RECTIFIER WITH NON-LINEAR LOAD RESISTANCE

(75) Inventor: Thomas Reichel, Baldham (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 09/525,126

(22) Filed: Mar. 14, 2000

(30) Foreign Application Priority Data

Mar. 24, 1999 (DE) .......................................... 199 13 338

(51) Int. Cl.[7] .................................................. H03L 5/00
(52) U.S. Cl. ...................................... 327/330; 327/325
(58) Field of Search ...................... 363/37, 44; 327/104, 327/325, 330, 531

(56) References Cited

U.S. PATENT DOCUMENTS

| 4,153,862 A | * | 5/1979 | Lim ............................ 315/408 |
| 4,491,903 A | * | 1/1985 | Montague .................... 327/311 |
| 4,638,138 A | * | 1/1987 | Rosa et al. ..................... 363/37 |
| 4,691,270 A | * | 9/1987 | Pruitt ......................... 363/56.05 |
| 5,389,869 A | * | 2/1995 | Anderson .................... 327/260 |
| 5,422,804 A | * | 6/1995 | Clark ........................... 363/44 |
| 5,804,993 A | * | 9/1998 | Suzuki ........................ 327/104 |
| 6,049,472 A | * | 4/2000 | Suzuki et al. ................. 363/37 |
| 6,291,982 B1 | * | 9/2001 | Prabhu ........................ 324/95 |

OTHER PUBLICATIONS

Hoer et al., IEEE Transactions on Instrumentation and Measurement, vol. IM–25, No. 4, Dec. 1976, Measuring and Minimizing Diode Detector Nonlinearity, pp 324–329.

* cited by examiner

*Primary Examiner*—Timothy P. Callahan
*Assistant Examiner*—Terry L. Englund
(74) *Attorney, Agent, or Firm*—Birch, Stewart, Kolasch & Birch, LLP

(57) ABSTRACT

In a half-wave or multi-path RF diode-rectifier circuit having at least one rectifier diode and at least one output-side charging capacitor, the output is loaded with a non-linear load resistance having approximately the same relative temperature coefficient as the video resistance at zero bias of the rectifier diode and being non-linear, so that linearization of the relationship between output voltage and the square of input voltage is carried out beyond the square-law range.

21 Claims, 4 Drawing Sheets

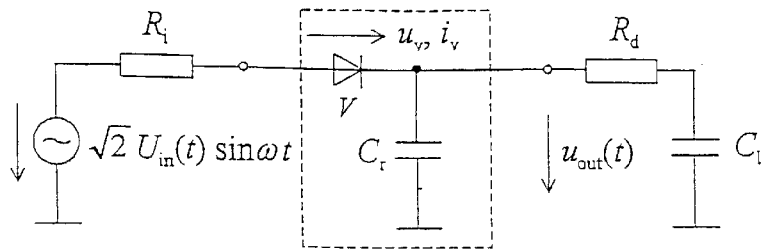
Fig. 1
PRIOR ART
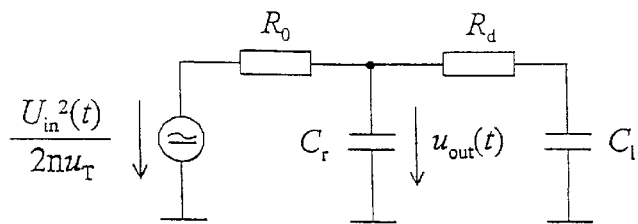
Fig. 2
PRIOR ART
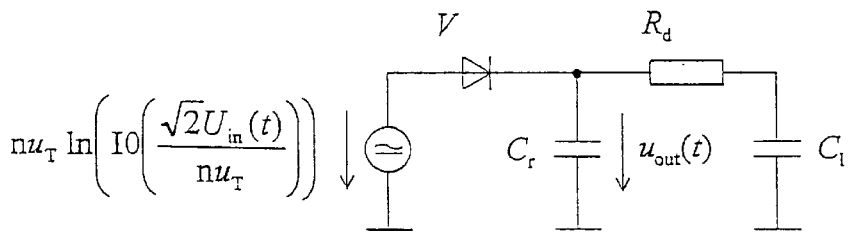
Fig. 3
PRIOR ART
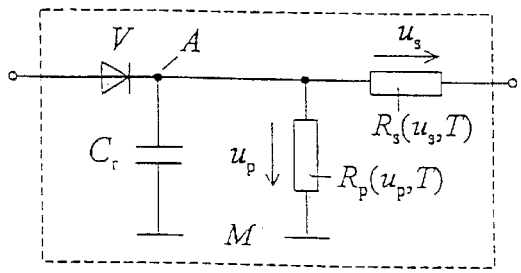
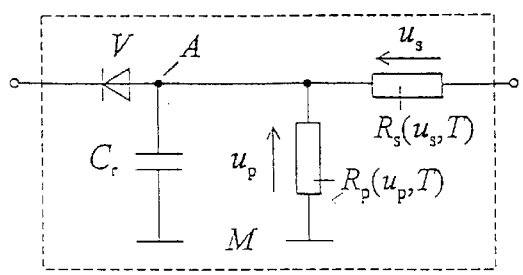
Fig. 4a                                  Fig. 4b

DIODE-RECTIFIER WITH NON-LINEAR LOAD RESISTANCE

BACKGROUND OF THE INVENTION

This invention relates to a half-wave, full-wave or multi-path RF diode-rectifier circuit having at least one rectifier diode and at least one output-side charging capacitor.

Diode-rectifier circuits of this type, based on junction or Schottky diodes, are known in an extremely wide variety of embodiments. FIG. 1 shows a basic wiring diagram that is common to all these circuits, having a diode V and a charging capacitor $C_r$. These can be manufactured with very small time constants, and because of their thereby higher measuring speed, they are often used instead of thermal sensors for power measurements. Such rectifier circuits are also used for rms voltage measurements. A clear interrelationship, independent of a type of signal, between an average value of an output voltage and an rms value $U_{in}$ of an input voltage is essential for power and rms voltage measurements, so that according to the equation $$P_{in} = \frac{U_{in}^2}{Z_0} \tag{1}$$

power converted in a terminating resistor $Z_0$ of a power sensor can be calculated. Narrow limits are set for the diode rectifier relative to a dynamic range, because of exponential voltage-current characteristics of the semiconductor. That is, in only a relatively small range of the input voltage, a so-called square-law range, is the output voltage dependent exclusively on the rms value of the input voltage, so that strictly speaking, only within that range are power measurements possible for all signal shapes and modulation types. Outside the square-law range, a peak value of the input voltage determines, to an increasing extent, a level of the output voltage, so that the clear interrelationship between output voltage and input power is lost. Only if one limits oneself to a specific signal type—for example unmodulated spectral-pure signals—can the specific interrelationship between the rms value of the input voltage and the output voltage for that signal be used to perform accurate power measurements also outside the square-law range. However, as soon as the input signal varies from a curve shape for which the rectifier was calibrated (for example, measurement of a sine-wave signal with harmonics instead of a spectral-pure sine-wave signal), or an envelope of the measurement signal is modulated (AM, π/4 DQPSK, QAM, etc.), measurement deviations occurs outside of the square-law range.

To expand a proportional zone between output voltage and input power beyond the square-law curve range, it is known to load the output of the rectifier with an ohmic resistor $R_p$ (negative temperature coefficient (NTC) thermistor) that is selected to be appropriate for the video resistance $R_0$ at zero bias of the rectifier diode, (Hoer, C. A., Roe, K. C., Allread, C. M.: Measuring and Minimizing Diode Detector Nonlinearity, IEEE Transactions on Instrumentation and Measurement. Vol. IM-25, No. 4, December 1976, pp. 324–329). If the suitable dimension is $R_p=0.4 \times R_0$, a 17 dB improvement in the dynamic range is achieved in comparison to an unloaded rectifier diode; however, because of the loading with the ohmic resistor, the output voltage is also simultaneously reduced to approximately ⅓ of the no-load value, so that an effective increase in the proportional area of only approximately 12 dB can be assumed.

This known circuit, because of the inadequate matching between the rectifier and the load resistor, is also strongly temperature-dependent and therefore is only conditionally suitable for mass production.

It is an object of this invention to provide a diode-rectifier circuit whose dynamic range can be expanded beyond the square-law range using uncomplicated circuit elements and that has an improved thermal behavior so that, for example, average power value measurements of modulated sine signals are also possible, even into the GHz range.

This object is achieved by using, with a single- or multi-path RF diode-rectifier circuit of the preamble of the main claim, the characterizing features recited in the main claim. Advantageous enhancements are set forth in the dependent claims.

SUMMARY OF THE INVENTION

According to the invention, instead of a linear ohmic resistor (NTC thermistor), a non-linear load resistor, having a relative temperature coefficient that is selected to be equal to a video resistance at zero bias of the rectifier diode, is used. Because of the non-linearity of the load resistor, a higher output voltage is achieved than with a linear load resistor, and through temperature synchronism of the load resistor and the video resistance, the temperature coefficient of the output voltage corresponds to that of an unloaded rectifier, and an increase in the proportional area is approximately 10 dB. With relatively little circuit-technology expense such a diode-rectifier circuit is achieved, with which also measurements of average power value or the rms voltage value of modulated sine signals outside the square-law of characteristic curves of the rectifier diode are possible. Also, an input impedance remains largely the same outside the square-law range.

A non-linear load resistor is understood to be a resistor in which the relationship of applied voltage and current is not linear, as is represented, for example, by a conventional voltage-current characteristic of a diode. For this reason, the non-linear load resistor is preferably also realized by such a diode.

BRIEF DESCRIPTION OF THE DRAWINGS

The invention is described in more detail below using schematic drawings of embodiment examples.

FIG. 1 is a circuit diagram of a prior art basic half-wave rectifier;

FIG. 2 is a prior-art equivalent circuit diagram for output currents far below the reverse saturation current of the diode;

FIG. 3 is a prior-art equivalent circuit diagram for input voltages of any magnitude;

FIGS. 4a and 4b are circuit diagrams of a first embodiment of the invention for a half-wave rectifier circuit;

DESCRIPTION OF THE PREFERRED EMBODIMENT

Figure 5:
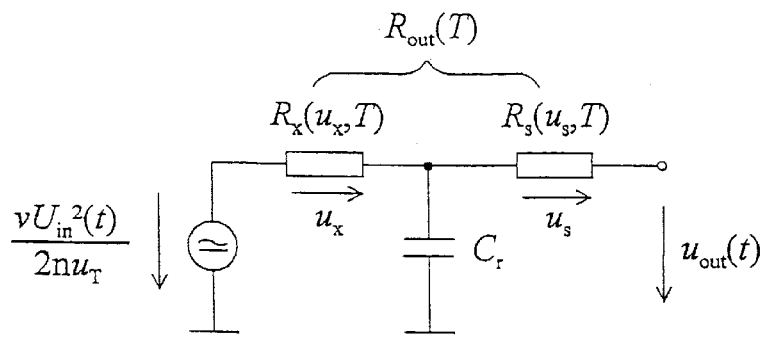
FIG. 5 is an equivalent circuit diagram of a modification of the FIGS. 4a and 4b circuit.

For a basic circuit of a half-wave rectifier shown in FIG. 1, assuming an ideal diode V, the following relationship exists between voltage $u_v$ and current $i_v$:

$$i_v = i_s \cdot \left[\frac{u_v}{e^{nu_T}} - 1\right] \qquad (2)$$

Herein, $i_s$ is the reverse saturation current of the diode, for which in the case of a Schottky diode, the formula $$i_s = AR*T^2 e^{\frac{-e_0\phi_{bn}}{kT}} \qquad (3)$$

applies. n is a correction factor, also known as ideality factor, that is influenced by the technology used, and ranges from 1.0 to 1.5. $u_T$ is known as voltage equivalent of thermal energy and depends only on—in addition to two natural constants—the absolute temperature T as per:

$$u_T = \frac{kT}{e_0} \qquad (4)$$

A: cross-sectional area; R*: modified Richardson's constant; k: Boltzmann's constant ($1.38 \cdot 10^{-23}$ J/K), $e_0$: fundamental electronic charge ($1.60 \cdot 10^{-19}$ C), T: temperature in K, $e_0\Phi_{Bn}$: potential barrier.

As seen in equation (2), the voltage-current characteristics of a rectifying diode can be completely represented by the inverse saturation current $i_s$, and the ideality factor. However, instead of $i_s$, the video resistance of the diode at zero bias is more often used, which is linked to the ideality factor n and $i_s$ via the relationship:

$$R_0 = \frac{nu_T}{i_s} \qquad (5)$$

$R_0$ has a direct physical significance, which indeed involves the ohmic resistance of the diode at small signal excitations, which is noticeable as an input and output resistance of the rectifier. Because of its connection with $i_s$, the video resistance has the same strong temperature dependency, and in fact—depending on the barrier level $e_0\Phi_{Bn}$—a doubling or halving is to be expected approximately every 15 K.

The rectifier of FIG. 1 is fed from a source having internal resistance $R_i$ and sinusoidal electromotive force having the rms value $U_{in}$, the output voltage is further processed in a circuit whose input is represented by a capacitance $C_1$ (the ohmic input resistance of the following circuit should be so large that it can be disregarded). It is the task of a resistor $R_d$ to decouple an input of the following circuit from the rectifier, high-frequency wise. Far above a lower frequency limit of the rectifier, which is determined by the video resistance of the diode at zero bias and the load capacity $C_r$, and disregarding $R_i$, the whole input voltage $U_{in}$ drops across the diode, so that the output voltage $u_{out}$ of the rectifier can be described by the equation:

$$u_{outt} = nu_T \ln\left[IO\left[\frac{\sqrt{2}\,U_{in}}{nu_T}\right]\right] \qquad (6)$$

It can be seen from equation (6) that in a simple diode model, only one diode-specific parameter, the factor n, determines the level of the no-load output voltage.

$IO(\ldots)$ is the modified Bessel function of first kind and zero order, that can be expanded is into a power series with regard to $U_{in}$. Disregarding higher-order components, in the square-law range one obtains $$u_{out} \approx \frac{U_{in}^2}{2nu_T} \qquad (7)$$

and for very high input voltages $$u_{out} \approx \sqrt{2}\,U_{in} \qquad (8)$$

For output currents far below the reverse saturation current of the diode, as may occur with a passive load and driving within the square-law range, the output resistance is identical to the video resistance at zero bias $R_0$ of the diode, and the linear equivalent circuit diagram of FIG. 2 applies. Because of the linear circuit parameters and the proportionality between the no-load output voltage and $U_{in}^2$, it is ensured that, when there is a time-variable amplitude of the input signal, the average value of the output voltage $u_{out}$ is always proportional to the average value of $U_{in}^2$ namely it is proportional to the average power value of the measuring signal.

In the equivalent circuit diagram for input voltages of any magnitude of FIG. 3, the rectifier diode V must appear in the place of $R_0$, and the no-load output voltage is, according to equation (6), no longer linearly dependent on the input power. The non-linear output impedance of the rectifier becomes noticeable as interference when the load impedance of $C_r/(R_d+C_1)$ can no longer be disregarded relative to $R_0$, that is, for higher frequency components of the rectified voltage. For this a drive-dependent voltage division appears which leads to a kind of second rectification, and the output voltage can increase beyond the average value of the open-circuit voltage. The effect is particularly noticeable for broad-band RF signals having a high crest factor (for example, W-CDMA), which—in accordance with the high band-width—contain higher frequency parts of greater amplitude in the rectified voltage.

In order to increase the measuring range of the rectifier, in which a behavior like that of FIG. 2 is sought, two steps are necessary: On the one hand, the open-circuit voltage must be proportional to $U_{in}^2$ over a larger range than is provided through the square-law range, and on the other hand, the output resistance of the circuit must be linearized, and the second measure may be omitted if, for all spectral components of the rectified voltage, it is assured, that the associated load impedance is large relative to the video resistance at zero bias of the diode, that is, no drive-dependent division is to be expected.

FIG. 4 shows a first embodiment of the invention for a half-wave rectifier circuit, and indeed FIG. 4a shows an arrangement of the diode V for positive output voltage and FIG. 4b shows an arrangement for negative output voltage. According to the invention, a non-linear load resistance $R_p$ is connected between the rectified voltage output A and a common reference point M of the input voltage. For current-voltage characteristics of an optimal load resistance $R_p$, the relationship $$i_p = i_s \cdot \left[IO\left[2\sqrt{\frac{u_p}{vnu_T}}\right]e^{\frac{u_p}{nu_T}} - 1\right] \qquad (9)$$

can be derived from equations (2) and (6). Depending on the division ratio v, the relationship of the output voltage to the open-circuit output voltage of the rectifier in the square-law range, it delivers an optimal range of a current-voltage characteristic, which can then be approximated in various ways.

As derived from (9), the load resistance $R_p$ must always have the same relative temperature dependence as the video resistance of the rectifier diode V, so that the linearization is maintained across larger temperature ranges. Preferably, therefore, the load resistance will be structured as an individual diode matched to the rectifier, or as a network of matched diodes, that have the same temperature dependence as the rectifier diode V.

The non-linear output resistance of a circuit of this invention can also be compensated by a series-connected, non-linear, resistance $R_s$ according to FIG. 4, so that the linear output equivalent circuit diagram of FIG. 5 results, with a linear output resistance $R_{out}$ and a power-proportionate open-circuit voltage.

With a non-linear load resistance $R_p$ of this invention, that is preferably in thermal contact with the diode V and thus is at the same temperature level as the diode V, the proportional area is increased by approximately 10 dB, that is, essentially by the same value as in a known circuit with a linear load resistance, but with significantly improved temperature behavior, more favorable behavior of the input admittance outside the proportional area, as well as higher output voltage at the same power.

Figure 6:
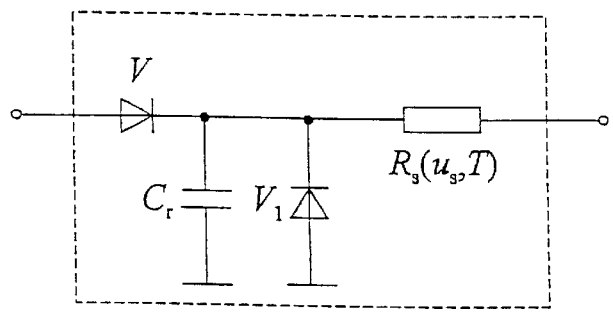
FIG. 6 is a circuit diagram of an embodiment having a series resistance.
Figure 7:
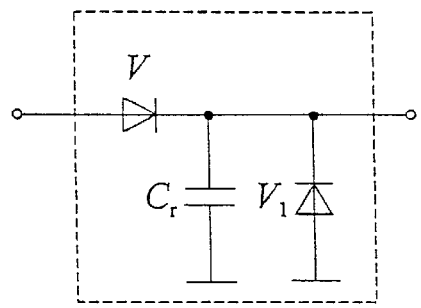
FIG. 7 is a circuit diagram of an embodiment of this invention without a series resistance; and Each of FIGS. 8, 9, 10, 11, 12a, 12b, 13 and 14 is a circuit diagram of a different embodiment of this invention.

As a non-linear load resistance $R_p$, a diode $V_1$ is preferably used, whose video resistance at zero bias and ideality factor agree as closely as possible to the corresponding parameters of the rectifier diode V. FIG. 6 shows an embodiment having a series resistance $R_s$, and FIG. 7 shows an embodiment without a series resistance. The video resistance at zero bias of the single diode differs by no more than −50%/+100%, particularly by no more than ±10%, from the video resistance at zero bias of the rectifier diode (V, $V_a$, $V_b$), and the polarity thereof is such that it is driven in reverse direction by the rectified voltage (FIG. 6).

In using paired diodes for the rectifier diode V and the load diode $V_1$, for example at adjacent positions on a chip, (commercially available in the form of diode pairs or four-diode sets), temperature tracking of all parameters can actually be assumed. It must, therefore, merely be ensured that all diodes are arranged at the same temperature level. The functioning of the circuit is then guaranteed across a very wide temperature range. Both properties, that is, the temperature tracking of the parameters and approximately the same temperature level, are automatically present if the diodes are structured as components of a monolithic integrated circuit.

In comparison to a circuit having a linear ohmic load (NTC thermistor), the input admittance of a circuit of this invention, outside the proportional area, is significantly less strongly dependent on the level of input voltage than in a circuit having a linear ohmic load. This is particularly advantageous in circuits in which it is impossible to prevent at least one rectifier from being driven far beyond the proportional area. The less an over-driven rectifier thereby changes its input impedance, the less the remaining circuit is thereby affected, and the less an input-side matching of the circuit changes. Additionally, in a circuit of this invention, the input admittance decreases when the proportional area is exceeded—the circuit becomes higher in impedance—whereas it increases in a circuit having a linear load resistance. The interfering signals emitted by the rectifier into the measured object are thus minimized, whereas they increase in the circuit having the linear load resistance.

Because of the non-linearity of the current-voltage characteristics of the load diode, a circuit of this invention can deliver a higher output voltage than can a circuit having a linear load resistance. If the rectifier and load diodes have the same video resistance at zero bias, the output voltage of a circuit of this invention in the square-law range amounts to exactly half of the output voltage of the open-circuit rectifier, whereas in the circuit with a NTC thermistor it comes to just 29% of the open-circuit voltage. Hence, the circuit of this invention permits measurements of somewhat smaller power than does a circuit having an NTC thermistor.

Figure 8:
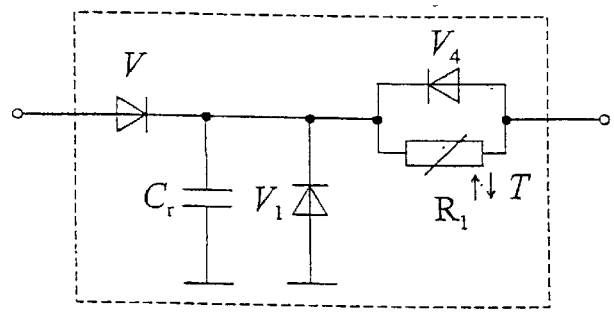
Figure 9:
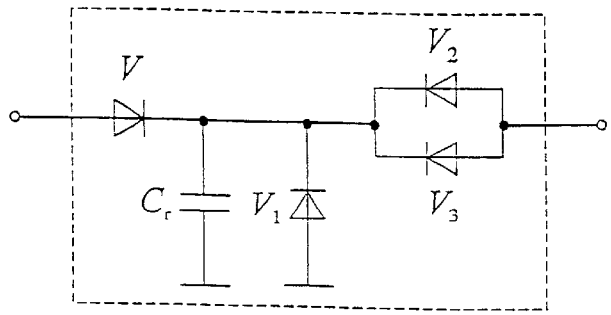

For wide band modulated signals, measurement errors can occur outside the square-law range because of dynamic voltage division by the charging capacitance ($C_r$) and the input capacitor of the connected circuit ($C_1$). While the charging capacitor can, for the most part, be kept sufficiently small—broad band modulated signals are commonly employed at frequencies above 500 MHz and charging capacitors of a few pF are sufficient for that purpose—certain limits are set for the reduction of $C_1$. The problems can be significantly reduced if a suitable non-linear resistance $R_s$ is connected between the output of the rectifier and the input of the following amplifying circuit according to FIG. 4, with which the output resistance can be linearized. Then the effect of $C_1$ can also be disregarded. In the simplest case, according to FIG. 9, the added non-linear resistance $R_s$ is of two parallel-connected diodes $V_2$ and $V_3$ matched to the rectifier and load diodes relative to the video resistance, or as in FIG. 8, of only one diode $V_4$ matched to the rectifier and load diodes relative to the video resistance and one parallel-connected NTC thermistor $R_1$. The resistance of the NTC thermistor should be selected to be somewhat larger than the video resistance of the diode, for example, 1.55 times. The temperature coefficient of the NTC thermistor $R_1$ must be matched to the temperature coefficients of the video resistance of the diodes. The resistance of the NTC thermistor is selected preferably to be 55%±25% larger than the video resistance at zero bias of the rectifier diode (V), or the average value of the video resistances at zero bias of the rectifier diodes ($V_a$, $V_b$) The relative temperature coefficient of the non-linear load resistance differs by no more than ±25%, preferably by no more than ±2%, from that of the video resistance at zero bias of the rectifier diode (V).

The best results with respect to expanding the proportionality range are in fact achieved when the rectifier and load diodes exhibit absolutely identical properties. However, in some circumstances, it may be useful to select the video resistance of the load diode $V_1$ at zero bias to be somewhat smaller than that of the rectifier diode, because then even an additional expansion of the proportionality range (at the expense of linearity at low power) is possible. Such asymmetrical dimensioning is possible in three ways: through suitable matching, through manufacturing diodes having differing geometries (according to the relationship of the video resistances) on a single wafer or as components of a monolithic integrated circuit, or through parallel connection of a diode having a multiple of the video resistance of the rectifier diode parallel to the load diode. If the video resistance of the parallel-connected diode is chosen, for example, 10 times as great as that of the rectifier diode, this corresponds to a ratio of r=0.9 of the video resistance. Therefore, when matching is discussed, a defined, small variation from absolute equality should be included.

The requirements concerning matching of other parameters vary. It is important that the ideality factor n and the relative temperature coefficient of the video resistance at zero bias of the rectifier and load diodes be in good agreement.

Figure 10:
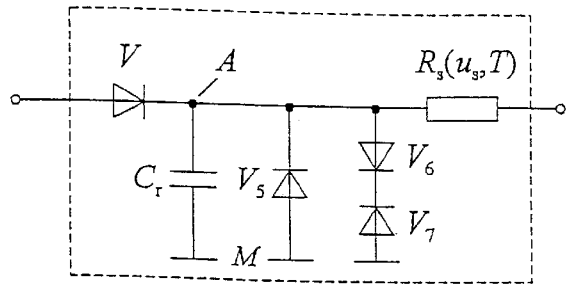
Figure 11:
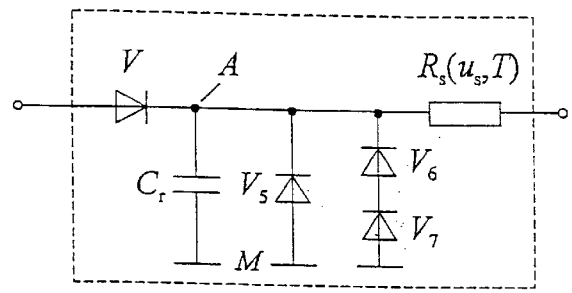

FIGS. 10 through 14 show additional embodiments of a rectifier circuit of this invention that have similar favorable characteristics relative to expanding the proportionality range as do the embodiments of FIGS. 6 through 9. In the circuit according to FIG. 10, the non-linear resistance is formed by three diodes $V_5$, $V_6$, and $V_7$ as is also the case in the FIG. 11 embodiment. In FIG. 10, the one diode $V_5$, like the single diode $V_1$, is again connected between the direct voltage output A and ground M, and the other two diodes $V_6$ and $V_7$ are arranged in series, in opposite directions, parallel thereto, between the output A and ground M. In the embodiment of FIG. 11, these two diodes $V_6$ and $V_7$ are connected in series, having the same polarity, and are arranged between the output A and ground M. The non-linear load resistance could also be formed by an even larger number of matched diodes; with it being important to have as close agreement as possible between the relative temperature coefficients of the video resistances of all these diodes.

Figure 12A:
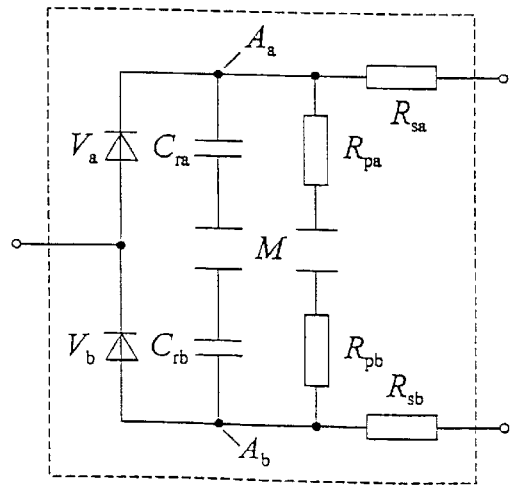
Figure 12B:
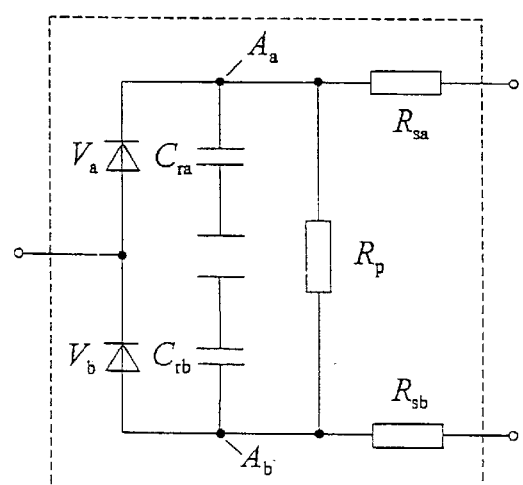

The circuits already discussed have been, without exception, half-wave rectifiers, that is, each has been an arrangement having one rectifier diode that delivers a positive or negative output voltage depending on its orientation. Of course, all the features of the invention are transferable to full-wave rectifier circuits. In the simplest instance, a full-wave rectifier, according to FIG. 12a, is of two nearly identical rectifier diodes $V_a$ and $V_b$, that are fed with the same RF voltage and differ only in the orientation of the diodes, with one rectifier diode supplying a positive output voltage, the other a negative output voltage (full-wave rectifier with bipolar output voltage). Each of the two rectifier diodes can be associated with a corresponding non-linear load resistance. Often, however, only a differential output voltage between the two outputs is further processed, in order to attenuate the common-mode portion. In this case, the two load resistances are connected, or only one load resistance is connected between the two outputs $A_a$ and $A_b$, that is twice as large as that for a correspondingly-dimensioned half-wave rectifier (FIG. 12b). The series resistances $R_{sa}$ and $R_{sb}$ for linearizing the output resistance remain unchanged.

Figure 13:
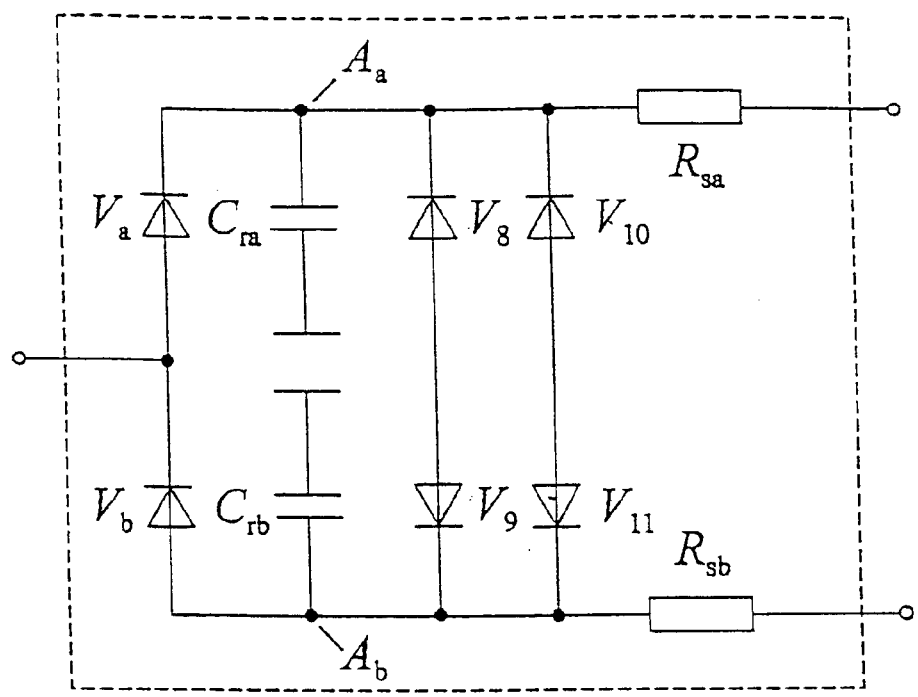

Additionally, the load resistance may be dimensioned for full-wave rectifiers in ways that cannot be transferred to half-wave rectifier circuits, as shown in FIG. 13. In this circuit, two respective sets of two diodes, $V_8$ and $V_9$ or $V_{10}$ and $V_{11}$, arranged in series, with opposite polarity, are between the outputs $A_a$ and $A_b$.

Figure 14:
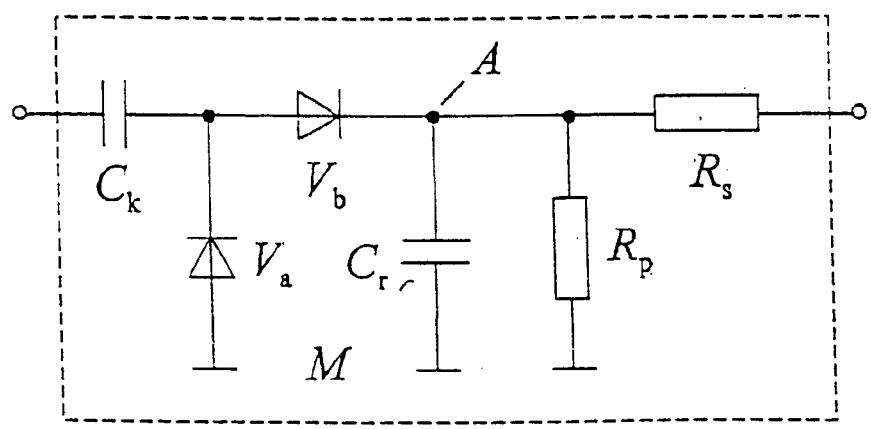

FIG. 14 shows a full-wave diode-rectifier circuit having unipolar output voltage. The input voltage is fed via a coupling capacitor $C_k$ to the two rectifier diodes $V_a$ and $V_b$, to which a common charging capacitor $C_r$ is allocated. Here again, a non-linear load resistance $R_p$ and a series resistance $R_s$ are provided, that are each, once again, dimensioned to be twice as large as for a correspondingly dimensioned half-wave diode-rectifier circuit, but are otherwise structured in accordance with the exemplary embodiments presented above.

The invention is also applicable for voltage multiplier circuits; in a simplest case, here again the dimensioning of a half-wave diode-rectifier circuit is used, and both the load resistance $R_p$ and the series resistance $R_s$ are selected accordingly to be N times as large as for the half-wave circuit, where N is the voltage-multiplication factor.

What is claimed is:

1. Half-wave RF-diode-rectifier circuit for average power value measurement having at least one rectifier diode and at least one output-side charging capacitor forming a rectifier, wherein an output of the rectifier is loaded with a non-linear load resistance having substantially the same relative temperature coefficient as a video resistance at zero bias of the at least one rectifier diode, so that linearization of the relation of an RF-diode-rectifier-circuit output voltage to input power is effected beyond the square-law range, and wherein the non-linear load resistance is connected between the output of the rectifier and a measurement reference point of an input voltage of the rectifier circuit, wherein the non-linear load resistance comprises at least a single diode driven in reverse direction by a voltage from the rectifier's output.

2. Full-wave RF diode-rectifier circuit for average power value measurement, having a bipolar RF-diode-rectifier-circuit output voltage, comprising two rectifiers, each rectifier including at least one rectifier diode with an associated output-side charging capacitor, wherein a non-linear load resistance is connected respectively between each of two direct voltage outputs of the rectifiers and a measurement reference point of an input voltage of the full-wave RF diode-rectifier circuit and with each non-linear load resistance having substantially the same relative temperature coefficient as a video resistance at zero bias of the at least one rectifier diode of the rectifier feeding the non-linear load resistance, so that linearization of the relation of the RF-diode-rectifier-circuit output voltage to input power is effected beyond the square-law range and wherein each non-linear load resistance comprises at least a single diode whose polarity is such that it is driven in reverse direction by the direct voltage output of the rectifier feeding it.

3. Full-wave RF-diode-rectifier-circuit for average power value measurement, having a bipolar RF-diode-rectifier-circuit output voltage, comprising two rectifiers, each rectifier including at least one rectifier diode with an associated output-side charging capacitor, wherein a non-linear load resistance is associated with the two rectifiers by being connected between direct voltage outputs of the two rectifiers, with the non-linear load resistance having substantially the same relative temperature coefficient as a video resistance at zero bias of each of the rectifier diodes, so that linearization of the relation of the RF-diode-rectifier-circuit output voltage to input power is effected beyond the square-law range and wherein the non-linear load resistance comprises at least a single diode whose polarity is such that it is driven in reverse direction by the voltage outputs of the two rectifiers.

4. Full-wave RF-diode-rectifier-circuit for average power value, measurement, having a unipolar RF-diode-rectifier-circuit output voltage, comprising a coupling capacitor, a rectifier including at least one rectifier diode and at least one charging capacitor, wherein a non-linear load resistance is connected between a direct voltage output of the rectifier and a measurement reference point of an input voltage of the full-wave RF-diode-rectifier-circuit, with the non-linear load resistance comprising at least a single diode having substantially the same relative temperature coefficient as a video resistance at zero bias of the at least one rectifier diode, so that linearization of the relation of the RF-diode-rectifier-circuit output voltage to input power is effected beyond thee square-law range and the polarity of the at least single diode is such that it is driven in reverse direction by the direct voltage output of the rectifier.

5. Circuit as in claim 4, wherein the relative temperature coefficient of the non-linear load resistance differs by no more than ±2% from that of the video resistance at zero bias of the at least one rectifier diode of the rectifier associated therewith.

6. Circuit as in claim 4, wherein the non-linear load resistance comprises at least two diodes.

7. Circuit as in claim 4, wherein an ideality factor of the at least single diode forming the non-linear load resistance differs by no more than ±25% from that of the at least one rectifier-diode.

8. Circuit as in claim 4, wherein the non-linear load resistance and each rectifier diode of the rectifier associated therewith are arranged to have the same temperature level.

9. Circuit as in claim 4, wherein the at least single diode forming the non-linear load resistance and the at least one rectifier diode of the rectifier associated therewith are part of a monolithic integrated circuit.

10. Circuit as in claim 4, wherein the non-linear load resistance further comprises two additional series-connected diodes connected in parallel with the at least single diode, with at least one of the additional series-connected diodes being polarized in the same direction as is the at least single diode.

11. Circuit as in claim 4, wherein the non-linear load resistance comprises four diodes of which there are two series circuits, each series circuit having therein two of the diodes arranged in opposite directions in series, with these series circuits being in turn connected in parallel.

12. Circuit as in claim 4, wherein the rectifier includes at least two rectifier diodes and wherein the non-linear load resistance comprises two diodes connected in series in the opposite direction, whose video resistances at zero bias are half as large as the average value of two video resistances at zero bias of the at least two rectifier diodes.

13. Circuit as in claim 4, wherein an additional non-linear resistance is connected in series in a line forming the RF-diode-rectifier-circuit output for contributing to a linearization of the RF-diode-rectifier-circuit output resistance and whose relative temperature coefficient is matched to the relative temperature coefficient of the video resistance at zero bias of the at least one rectifier diode of the rectifier feeding the respective line forming the RF-diode-rectifier-circuit output.

14. Circuit as in claim 13, wherein the additional non-linear resistance connected in series includes a diode, whose temperature coefficient of video resistance at zero bias corresponds approximately to the temperature coefficient of the video resistance at zero bias of the at least one rectifier diode of the rectifier feeding the respective line forming the RF-diode-rectifier-circuit output.

15. Circuit as in claim 13, wherein the additional non-linear resistance connected in series comprises at least a single series diode.

16. Circuit, as in claim 15, wherein the at least a single series diode is driven in the reverse direction.

17. Circuit as in claim 13, wherein the additional non-linear resistance connected in series comprises at least one diode and at least one thermistor.

18. Circuit as in claim 13, wherein the additional non-linear resistance connected in series comprises two diodes connected in parallel in the same direction.

19. A half-wave RF-diode-rectifier-circuit, having at least one rectifier diode with at least one output-side charging capacitor forming a rectifier, wherein a direct voltage output of the rectifier is loaded with a non linear load resistance having substantially the same temperature coefficient as a video resistance at zero bias of the at least one rectifier diode, so that linearization of the relation of an RF-diode-rectifier-circuit output voltage to input power is effected beyond the square-law range, wherein the non-linear load resistance is connected between the direct-voltage output of the rectifier and a measurement reference point of an input voltage of the half-wave RF-diode-rectifier-circuit, and wherein the non-linear load resistance is formed by a single diode driven in reverse direction and connected in parallel with two additional series connected diodes at least one of which is polarized in the same direction as the single diode.

20. A full-wave RF-diode-rectifier-circuit, having bipolar output voltage, comprising two rectifiers, each including a rectifier diode and an output side charging capacitor, wherein an output of each rectifier is loaded with a non-linear load resistance having substantially the same temperature coefficient as a video resistance at zero bias of the rectifier diode of the respective rectifier feeding it so that linearization of the relation of the bipolar output voltage to input power is effected beyond the square-law range, wherein each of the two non-linear load resistances is formed by a single diode polarized in a reverse direction connected in parallel with two additional series connected diodes, with at least one of said additional diodes being polarized in the same direction as said single diode.

21. A full-wave RF-diode-rectifier-circuit as in claim 20, with the video resistance of each diode in each non-linear load resistance being respectively dimensioned according to an average value of the two video resistances at zero bias of the two rectifier diodes.

* * * * *